US011085672B2

(12) United States Patent
Campbell et al.

(10) Patent No.: US 11,085,672 B2
(45) Date of Patent: *Aug. 10, 2021

(54) SELF-HEATING THERMAL INTERFACE MATERIAL

(71) Applicant: International Business Machines Corporation, Armonk, NY (US)

(72) Inventors: Eric J. Campbell, Rochester, MN (US); Joseph Kuczynski, North Port, FL (US); Kevin A. Splittstoesser, Stewartville, MN (US); Timothy J. Tofil, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 76 days.

This patent is subject to a terminal disclaimer.

(21) Appl. No.: 16/268,890

(22) Filed: Feb. 6, 2019

(65) Prior Publication Data

US 2019/0170403 A1    Jun. 6, 2019

Related U.S. Application Data

(62) Division of application No. 14/937,944, filed on Nov. 11, 2015, now Pat. No. 10,309,692.

(51) Int. Cl.
*H01L 23/42* (2006.01)
*F24V 30/00* (2018.01)
*H01L 23/427* (2006.01)
*H01L 23/373* (2006.01)
*H01L 23/34* (2006.01)

(52) U.S. Cl.
CPC .............. *F24V 30/00* (2018.05); *H01L 23/34* (2013.01); *H01L 23/3737* (2013.01); *H01L 23/42* (2013.01); *H01L 23/4275* (2013.01)

(58) Field of Classification Search
CPC ..... F24V 30/00; H01L 23/4275; H01L 23/42; H01L 23/3737; H01L 23/34
USPC ........................................................ 523/210
See application file for complete search history.

(56) References Cited

U.S. PATENT DOCUMENTS

| | | | |
|---|---|---|---|
| 3,585,982 A | 6/1971 | Hollinshead | |
| 3,653,372 A | 4/1972 | Douglas | |
| 4,095,583 A | 6/1978 | Petersen | |
| 5,589,523 A | 12/1996 | Sawaoka | |
| 5,904,796 A | 5/1999 | Freuler | |
| 5,984,995 A | 11/1999 | White | |
| 6,114,413 A | 9/2000 | Kang | |
| 6,947,285 B2 | 9/2005 | Chen | |
| 7,290,549 B2 | 11/2007 | Banerjee | |
| 7,816,785 B2 | 10/2010 | Iruvanti | |
| 7,834,442 B2 | 11/2010 | Furman | |
| 7,886,813 B2 | 2/2011 | Hua | |
| 7,923,488 B2 | 4/2011 | Xu | |
| 8,174,112 B1 | 5/2012 | Karp | |
| 8,741,804 B2 | 6/2014 | Boday | |
| 8,865,030 B2 | 10/2014 | Koplin | |
| 8,896,110 B2 | 11/2014 | Hu | |
| 9,186,641 B2 | 11/2015 | Boday | |
| 9,307,692 B2 | 4/2016 | Boday | |
| 9,307,693 B2 | 4/2016 | Boday | |
| 9,313,946 B2 | 4/2016 | Boday | |
| 9,434,133 B2 | 9/2016 | Boday | |
| 9,694,337 B2 | 7/2017 | Boday | |
| 9,856,404 B2 | 1/2018 | Campbell | |
| 9,896,389 B2 | 2/2018 | Campbell | |
| 9,926,471 B2 | 3/2018 | Campbell | |
| 10,072,185 B2 * | 9/2018 | Campbell | ................ C09J 11/04 |
| 2005/0041406 A1 | 2/2005 | Matayabas | |
| 2006/0079021 A1 | 4/2006 | Yang | |
| 2006/0228542 A1 | 10/2006 | Czubarow | |
| 2008/0038540 A1 | 2/2008 | Hirayama | |
| 2009/0181254 A1 | 7/2009 | White | |
| 2013/0034739 A1 | 2/2013 | Boday | |
| 2014/0110049 A1 | 4/2014 | Yuen | |
| 2014/0368992 A1 | 12/2014 | Strader | |
| 2017/0129825 A1 | 5/2017 | Campbell | |
| 2017/0130102 A1 | 5/2017 | Campbell | |
| 2017/0130993 A1 | 5/2017 | Campbell | |
| 2018/0016474 A1 | 1/2018 | Campbell | |
| 2018/0063949 A1 | 3/2018 | Campbell | |

FOREIGN PATENT DOCUMENTS

| | | |
|---|---|---|
| CA | 918331 A | 1/1973 |
| CN | 103740978 A | 4/2014 |
| CN | 103740997 B | 4/2016 |
| CN | 108070134 A | 5/2018 |

(Continued)

OTHER PUBLICATIONS

Brown et al., "In situ poly(urea-formaldehyde) microencapsulation of dicyclopentadiene", Journal of Microencapsulation, vol. 20, No. 6, 2003, pp. 719-730.
Delcea et al., "Multicompartmental Micro- and Nanocapsules: Hierarchy and Applications in Biosciences", Macromolecular Bioscience, vol. 10, 2010, pp. 465-474.
Electrical Engineering Stack Exchange, "Is it Proper to Use an Internal Layer as a Heat Bed if I Want to Warm my Multilayer PCB", 2016, 3 pages.
Hu et al., "Controlled Rupture of Magnetic Polyelectrolyte Microcapsules for Drug Delivery", Langmuir, vol. 24, 2008, pp. 11811-11818.
Kawashita et al., "In vitro heat generation by ferrimagnetic maghemite microspheres for hyperthermic treatment of cancer under alternating magnetic field.", Journal of Materials Science: Materials in Medicine, vol. 19, Issue 5, 2008, 1897-1903 (Abstract Only, 2 pages), printed from <http://www.ncbi.nlm.nih.gov/pubmed/17914614> on Sep. 14, 2015.

(Continued)

*Primary Examiner* — Hannah J Pak
(74) *Attorney, Agent, or Firm* — Mark Bergner (57) ABSTRACT

A self-heating thermal interface material (TIM) may be formed using heating components dispersed within the TIM. The heating components may produce heat when the TIM is compressed. The heating components may be formed from microcapsules and the microcapsules may contain exothermic reactants. The reactants may be isolated from contact within the microcapsule until a compressive force is applied.

8 Claims, 7 Drawing Sheets

(56) References Cited

FOREIGN PATENT DOCUMENTS

| | | |
|---|---|---|
| JP | 2000317578 A | 11/2000 |
| JP | 2001176924 A | 6/2001 |
| JP | 4073571 B2 | 4/2008 |
| TW | 200425250 A | 11/2004 |
| WO | 2009029804 A2 | 3/2009 |
| WO | 2011086018 A1 | 7/2011 |
| WO | 2014204828 A2 | 12/2014 |

OTHER PUBLICATIONS

Keller et al., "Mechanical Properties of Microcapsules Used in a Self-Healing Polymer", Experimental Mechanics, vol. 46, 2006, pp. 725-733.

Kreft et al., "Shell-in-Shell Microcapsules: A Novel Tool for Integrated, Spatially Confined Enzymatic Reactions", Angewandte Chemie International Edition, vol. 46, 2007, pp. 5605-5608.

Lee, J.H., "Microencapsulated Heat Generating Material to Accelerate the Curing Process During Liquid Crystal Display Fabrication", NineSigma, Inc., 2014, 3 pages, printed from <https://ninesights.ninesigma.com/rfps/-/rfp-portlet/rfpViewer/2690> on Sep. 22, 2015.

List of IBM Patents or Patent Applications Treated as Related, dated Feb. 5, 2019, 2 pages.

Marzzacco, C., "The Effect of a Change in the Catalyst on the Enthalpy of Decomposition of Hydrogen Peroxide," pp. 12-13, Chem 13 News/Nov. 2008, reprinted from pp. 16-17, May 2001.

Masin, G., "The Chemistry of Hand Warmers", 3 pages, printed from <http://www.chemistryislife.com/the-chemistry-of-hand-warmer> on Sep. 14, 2015.

Stober et al., "Controlled Growth of Monodisperse Silica Spheres in the Micron Size Range," Journal of Colloid and Interface Science 26, pp. 62-69 (1968).

Unknown, "Advanced Technologies for LCD Assembly", Dow Corning Corporation, 2014, 4 pages, downloaded from <http://www.dowcorning.com/content/publishedlit/11-3437_Advanced_Technologies_LCD_Assembly.pdf?wt.svl=ELEC_LHH> on Oct. 23, 2015.

Unknown, "Flameless Chemical Heaters", 2014, zenstoves.net, 4 pages, printed from <http://zenstoves.net/Flameless.htm> on Sep. 14, 2015.

Unknown, "Flameless Ration Heater (FRH)", MREInfo.com, 2014, 5 pages, printed from <http://www.mreinfo.com/us/mre/frh.html> on Sep. 14, 2015.

Unknown, "Loctite Eccobond DS 6601", Henkel Corporation, 2013, 2 pages, downloaded from <https://tds.us.henkel.com/NA/UT/H NAUTTDS.nsf/web/C0DD8377AB27D639852571341005DC4A1/$File/LOCTITE%20ECCOBOND%20DS%206601-EN.pdf> on Oct. 27, 2015.

Unknown, "Materials for Sealing Liquid Crystal", Three Bond Technical News, Three Bond Co., Ltd., vol. 43, 1994, pp.1-8.

Unknown, "PTFE Coatings," Specific Heat of Some Common Substances, http://www.engineeringtoolbox.com/specific-heat-capacity-d_391.html, printed Jun. 23, 2015. 11:08 AM, 7 pgs.

Unknown, "Standard enthalpy change of formation (data table)", Wikipedia, the free encyclopedia, 2015, 12 pages, printed from <https://en.wikipedia.org/wiki/Standard_enthalpy_change_of_formation_%28data_table%29> on Sep. 14, 2015.

Unknown, "Technical Overview: Microencapsulation", microtek laboratories, inc., 4 pages, downloaded from <http://www.microteklabs.com/technical_overview.pdf> on Sep. 14, 2015.

Unknown, "Thermochemistry", 7 pages, downloaded from <http://smd.gytool.cz/downloads/thermochemistry_bar.pdf> on Sep. 14, 2015.

Xiong et al., "Towards Theranostic Multicompartment Microcapsules: in-situ Diagnostics and Laser-induced Treatment", Theranostics, vol. 3, Issue 3, 2013, pp. 141-151.

Yamaura et al., "Preparation and characterization of (3-aminopropyl) triethoxysilane-coated magnetite nanoparticles," Journal of Magnetism and Magnetic Materials, vol. 279, 2004, pp. 210-217.

\* cited by examiner

SELF-HEATING THERMAL INTERFACE MATERIAL

BACKGROUND

The present disclosure relates to the field of chemical compounds known as thermal interface materials (TIMs). More particularly the invention relates to the application of a TIM in joining heat-sourcing devices to heat-dissipating devices in electronic or mechanical assemblies. The thickness of the bond line of the TIM between the devices may affect thermal conductivity or other properties of the TIM. Higher compliance in a TIM can produce a thinner bond line, and heating a TIM can produce a higher compliance in the TIM.

Multi-compartmental microcapsules are known in the art to be formed in a variety of structural configurations (e.g., concentric, pericentric, innercentric, or acentric) to form compartments within the microcapsules. Compartments within a microcapsule may contain various chemical elements or compounds.

SUMMARY

A self-heating Thermal Interface Material (TIM) increases the temperature of a TIM during manufacture or repair of an electronic or mechanical assembly having one or more heat-sourcing and heat-dissipating devices joined at an interposing layer of the TIM. Aspects of the present disclosure describe a method for creating a self-heating TIM, a method for joining a heat-sourcing device with a heat-dissipating device including a self-heating TIM, and a self-heating TIM.

Particular aspects of the disclosure relate to a method of creating a self-heating TIM by selecting a TIM having a particular compliance at ambient temperatures and a higher compliance at an increased temperature. A TIM may be selected from a class of high performance TIMs, including phase-change TIMs, silicone based TIMs, and acrylate based TIMs (or, mixtures thereof). In an aspect of the disclosure the TIM may be a high performance TIM. The method includes forming heating components, determining a proportion of the TIM sufficient to heat the TIM to a temperature that produces the increased compliance, and dispersing heating components within the TIM. The heating components may produce heat when the TIM is subjected to a compressive force. The heating components may be formed so as to not alter desirable characteristics or properties of the TIM, such as its durability, thermal conductivity, shear strength, cohesive or bond strength, or other such properties.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

While the invention is amenable to various modifications and alternative forms, specifics thereof have been shown by way of example in the drawings and will be described in detail. It should be understood, however, that the intention is not to limit the invention to the particular embodiments described. Rather, the intention is to cover all modifications, equivalents, and alternatives falling within the spirit and scope of the invention.

DETAILED DESCRIPTION

Aspects of the present disclosure relate to a self-heating Thermal Interface Material (TIM). More particular aspects relate to a method of forming a self-heating TIM having heating components dispersed within the TIM. Other aspects of the disclosure relate to a method of applying a self-heating TIM between a heat-sourcing and heat-dissipating device, compressing the TIM to produce heat, and the increased temperature increasing the compliance of the TIM. Yet other aspects of the disclosure relate to forming a heating component for a self-heating TIM using multi-compartmentalized microcapsules.

Electronic devices—such as electronic circuit boards, electronic modules, silicon dies, and other electronic component—may produce excessive heat during normal operations. Mechanical devices also may generate excessive heat during normal operations, such as rotating mechanical shafts producing heat from friction, pipes conducting heated material, or other applications of mechanical devices in which a mechanical component creates or is subject to excessive temperatures. Dissipating heat from components that produce excessive heat (hereinafter, "heat-sourcing devices") may require joining the component with a heat-dissipating device, commonly referred to as a "heat sink", and generally made of materials highly conductive of heat and formed in shapes that increase heat-dissipating surfaces.

A TIM may be interposed between the heat-sourcing device and the heat sink to improve the efficiency of heat transfer from the heat-sourcing device to the heat sink. The thermal efficiency of a particular TIM derives from its intrinsic thermal conductivity. Certain classes of TIMs that have particularly good thermal conductivity and other desirable properties may be referred to as high performance TIMs. Properties of a high performance TIM may include the thermal conductivity of the TIM, the durability of the TIM, the shear strength of TIM, and/or the range of compliance of the TIM. For example, phase-change TIMs, silicone based TIMs, and acrylate based TIMs may be considered high performance TIMs. A high performance TIM may be formed as a mixture of various high performance TIMs.

A bond line is a layer of TIM interposed between one or more surfaces joining the devices. The thickness of the TIM bond line affects thermal conduction between the heat-sourcing device and the heat sink. A thick bond line reduces the efficiency of the TIM in transferring heat from the heat-sourcing device to the heat sink, and accordingly a thin bond line is desirable. During manufacture or repair of heat sourcing devices, a heat sink is commonly joined to the heat-sourcing device at an interposing bond line of a TIM. The thickness of the bond line is in part determined by the viscosity and corresponding compliance of the TIM. Compliance is a measure of the ability of the TIM to flow and TIMs with lower compliance produce thicker bond lines. Heating a TIM may increase its compliance and correspondingly produce a thinner TIM bond line.

Methods to heat a TIM may require heating an entire electronic or mechanical assembly containing the heat-sourcing device and heat sink, or to develop special devices or apparatus to direct heat to only components of an assembly having a heat-sourcing and heat sink device. To sufficiently increase the compliance a TIM to achieve a preferably thin bond line may require raising its temperature substantially, such as by as much as 30 degrees C. Heating an entire electronic or mechanical assembly can adversely affect or damage both the heat-sourcing and heat sink devices as well as other components of the assembly, and consequently may be impractical. Heating an entire assembly is also difficult or may not be possible during field repair of an assembly in a customer installation. Developing special devices to direct heat to only a combination of heat sourcing and heat sink devices is complex, time consuming, costly, and may be impractical according to the design of an assembly of for field repair of an assembly. A method of forming a self-heating TIM and a method of applying a self heating TIM in joining heat sourcing and heat sink devices overcomes these disadvantages.

Accordingly, the present disclosure describes a self-heating TIM, a method for creating the self-heating TIM, and a method for applying a self-heating TIM interposed between a heat sourcing device and a heat dissipation device.

Figure 1A:
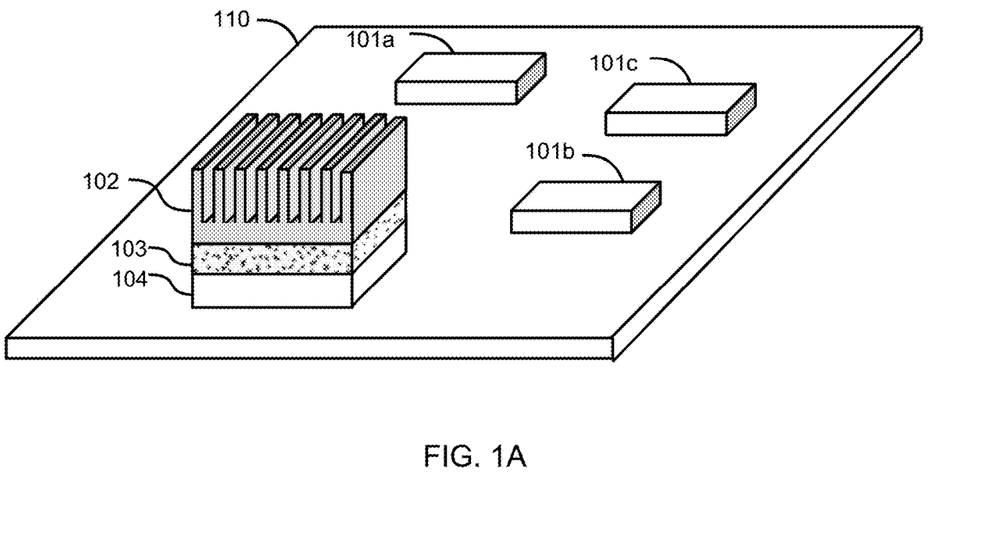
FIG. 1A is a diagram illustrating an electronic circuit board having a plurality of devices and a device with a heat sink joined to a device with an interposing layer of a TIM.

FIG. 1A illustrates an electronic assembly 100 having a circuit board 110, and a number of electronic components 101a, 101b, 101c, and 104. Some components of an assembly—such as 101a, 101b, and 101c—may not require application of a heat sink to dissipate heat in normal operations. Other components, such as component 104, may generate sufficient heat during operations as to require a heat sink 102 to dissipate the heat. For example, the component 104 may be an electronic circuit module, a circuit chip, a circuit die, a power supply, or a thermal plane within the circuit board 110 that may generate or conduct excessive heat during normal operations. Such components may require a heat sink, such as heat sink 102, to dissipate the excess heat.

A bond line 103 of a TIM may be interposed between the component 104 and the heat sink 102. The TIM may be a high efficiency TIM that has particularly desirable thermal or other properties; for example, phase-change TIMs, silicone based TIMs, and acrylate based TIMs may be high efficiency TIMs. A self-heating TIM may be made from a high efficiency TIM.

Figure 1B:
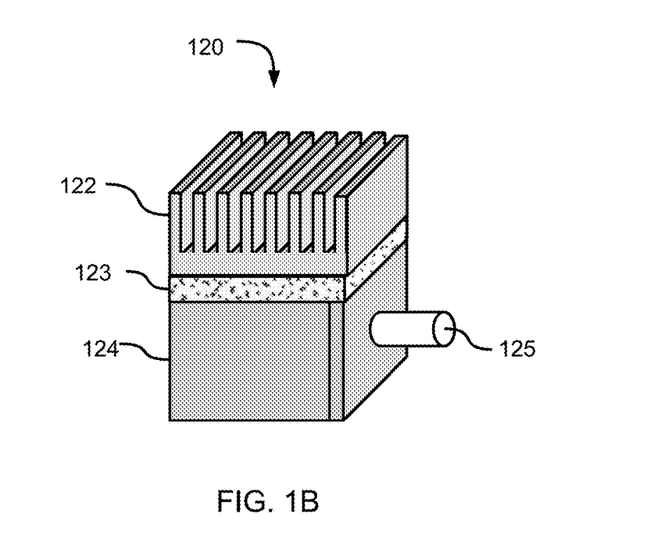
FIG. 1B is a diagram illustrating a mechanical device having a heat sink joined to the device with an interposing layer of a TIM, according to various embodiments.

FIG. 1B depicts an application of a heat sink to a mechanical device. For example, an electric motor 124 may have a rotating shaft 125 and the motor 124 may produce excessive heat during normal operations. The electric motor 124 may require a heat sink 122 to dissipate the excess heat produced while operating and the heat sink 122 may be joined to the electric motor 124 with an interposing layer of a TIM 123. In various embodiments, the mechanical device may be any mechanical device or apparatus (e.g., a pipe) that, through friction or conduction of heat through its internal components or surfaces, may require a heat sink to dissipate heat from the device.

Figure 2A:
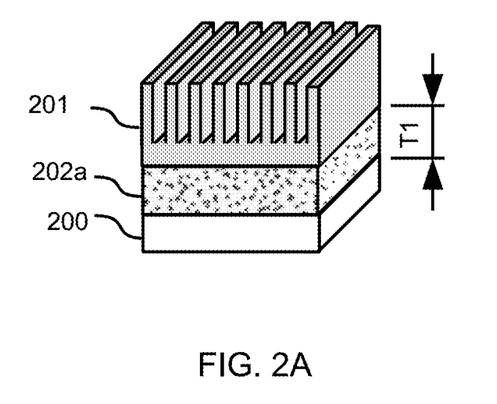
FIG. 2A illustrates a heat sink and electronic module with an interposing layer of TIM at ambient temperatures, according to various embodiments.
Figure 2B:
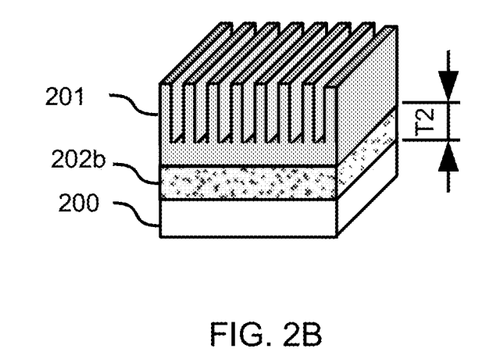
FIG. 2B illustrates a heat sink and electronic module with an interposing layer of TIM at higher temperatures, according to various embodiments.

FIG. 2A depicts an electronic component 200 and a heat sink 201 having an interposing bond line of a TIM. For purposes of the disclosure, and with respect to FIG. 2A and FIG. 2B, "TIM 202" refers generically to a TIM placed between an electronic component 200 and a heat sink 201. In FIG. 2A and FIG. 2B a particular instance of a TIM is referenced as TIM 202 with a letter appended to it, such as TIM 202a and TIM 202b.

Temperatures typical of manufacture or field repair (hereinafter, "ambient temperatures") may range between 25 (i.e., room ambient) and 35 degrees C. At ambient temperatures of an electronic assembly a TIM 202 may have a particular thickness T1 of a bond line, indicated as TIM 202a. The thickness T1 may be commensurate with the compliance of a TIM 202 at an ambient temperature. For example, TIM 202a may be a high performance TIM, and at an ambient temperature the TIM 202a may have a bond line thickness T1 of more than 5.0 microns.

Increasing the temperature of a TIM 202 may increase the compliance of the TIM, and may produce a thinner bond line of the TIM 202. FIG. 2B illustrates TIM 202a at an increased temperature (e.g. by 30 or more degrees Celsius above room ambient), indicating Tim 202a at an increased temperature as TIM 202b. The increased temperature may increase the compliance of the TIM and may produce a bond line of the TIM 202b having thickness T2, and the bond line thickness may be commensurate with the increased compliance. For example, increasing the temperature of the TIM 202a by 30 or more degrees Celsius above room ambient may result in a thickness T2 of the bond line of TIM 202b less than 2.0 microns.

Ambient temperature, ranges of temperatures, and thickness T1 and T2 of the TIM 202 bond line are disclosed for purposes of illustration and understanding of the disclosure, and are not meant to otherwise limit the scope of embodiments of the invention.

Heating a TIM 202 may result from applying a compressive force to the TIM. In embodiments the compressive force may result from pressing the heat-dissipating structure 201 and the electronic component 200 together at the point of the interposing bond line. In some embodiments the compressive force may be applied temporarily at the time of manufacture or field repair by mechanically pressing the heat sink 201 to the component 200 manually or with a machine or tool adapted for manufacture of the electronic assembly. In other embodiments the compressive force may result from mechanically fastening the heat sink to the component with screws, springs, bolts, or other mechanical devices common in the art to mechanically fasten a heat sink to an electronic or mechanical component.

In various embodiments, the TIM 202 may be self-heating and the heat to produce a thinner bond line, T2, may be produced by the compressing the TIM 202 in the manners described. In an embodiment the amount of compressive force applied to the TIM 202 may be determined by the process to manufacture or repair the electronic assembly or its components without damaging the heat sink 201 or electronic component 200. A self-heating TIM may be composed so as to produce heat at the typical compressive load of that particular manufacture or repair process.

Figure 3A:
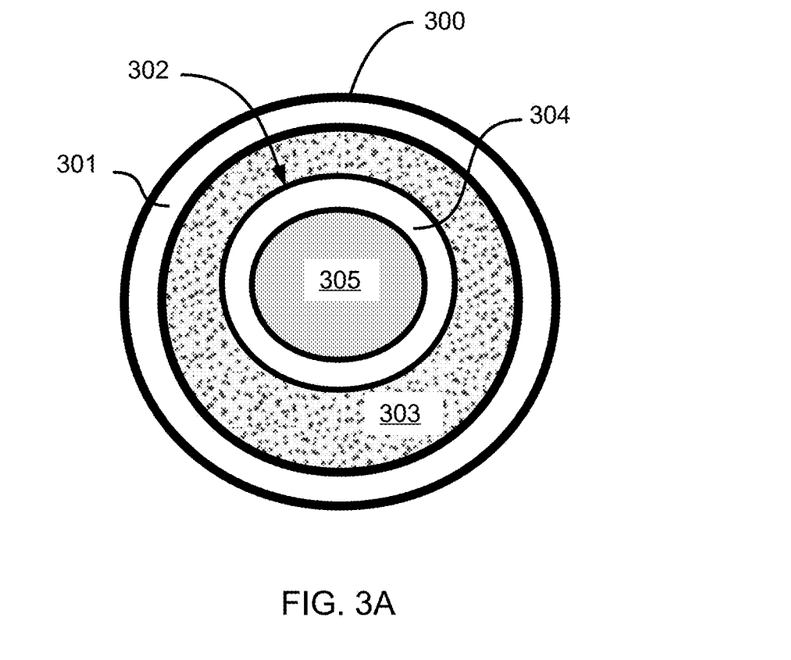
FIG. 3A depicts a multi-compartmentalized microcapsule, according to various embodiments.

FIG. 3A illustrates a structure for a heating component according to the manner of the invention. A microcapsule 300 is a multi-compartmental microcapsule illustrated in a cutaway view, according to embodiments. Microcapsule 300 has an outer wall 301 and contains an inner microcapsule 302 and a first reactant 303. The inner microcapsule 302 has a capsule wall 304 and contains a second reactant 305. The first reactant 303 within the microcapsule 300 may surround the inner capsule 302 and the first reactant 303 may be prevented from contacting the second reactant 303 by the capsule wall 304 of the inner microcapsule 302.

The capsule wall 304 of the inner capsule 302 may be formed to rupture under a particular compressive force and the outer wall 301 of the microcapsule 300 may be formed so as to not rupture under that compressive force. Rupturing the capsule wall 304 of the inner capsule 302 may allow the second reactant 305 to contact the first reactant 303 and the reactants may then chemically or physically react. In various embodiments the reaction may be exothermic.

Figure 3B:
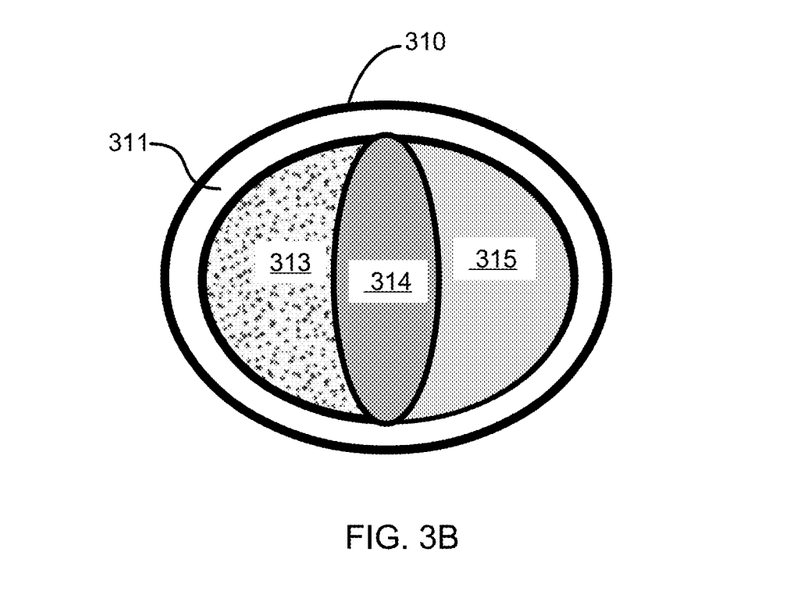
FIG. 3B depicts a multi-compartmentalized microcapsule having an inner barrier to form compartments, according to various embodiments.

FIG. 3B illustrates an alternative microcapsule structure. A microcapsule 310 is a multi-compartmental microcapsule illustrated in a cutaway view, according to embodiments. Microcapsule 310 has an outer wall 311 and contains a first reactant 313 and a second reactant 315. A membrane 314 within the microcapsule 310 may prevent the first reactant 313 and the second reactant 315 from coming into contact. The membrane 314 may be any form of a physical barrier that forms two or more compartments within the microcapsule 310.

The membrane 314 may be formed to rupture under a particular compressive force and the outer wall 311 of the microcapsule 310 may be formed so as to not rupture under that compressive force. Rupturing the membrane 314 may allow the first reactant 313 to contact the second reactant 315 and the reactants may then chemically or physically react. In various embodiments the reaction may be exothermic.

In embodiments the compressive force applied to a self-heating TIM may be within the range of that typical of that applied in the manufacture or repair of electronic assemblies or components having heat sinks, or in the manufacture or repair of mechanical assemblies or components that have heat sinks. In embodiments the inner capsule wall 304 of a microcapsule in the manner of microcapsule 300, or a membrane 314 of a microcapsule in the manner of microcapsule 310, may rupture at a force no greater than the lower bound of this range of compressive force. An outer wall 301 or 311 of a microcapsule may sustain, without rupturing, a force no less than the upper bound of this range of compressive force.

Other embodiments may utilize more than two reactants. The microcapsule 300 of FIG. 3A may contain a plurality of inner microcapsules, such as 302, and the inner microcapsules may themselves contain other, inner, microcapsules. The various microcapsules may contain reactants and may rupture under compression to allow the reactants to come into contact. Similarly, the microcapsule 310 of FIG. 3B may contain a plurality of compartments formed by a plurality of membranes or barriers, such as 314, and that the compartments may in turn contain one or more membranes or barriers, or may contain microcapsules. The various membranes or barriers may rupture under compression to allow the reactants to come into contact.

Figure 4A:
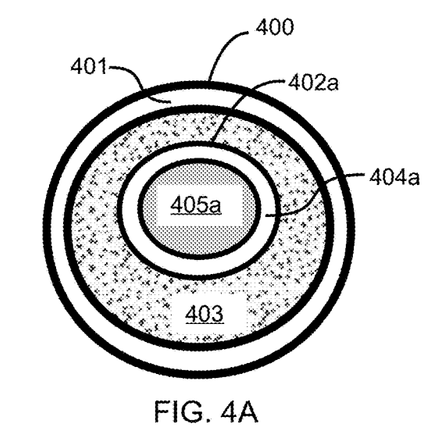
FIG. 4A illustrates a multi-compartmentalized microcapsule containing reactants and an inner microcapsule.
Figure 4B:
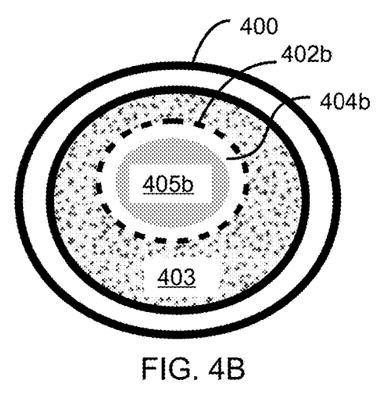
FIG. 4B illustrates a multi-compartmentalized microcapsule in which the capsule wall of an inner microcapsule is ruptured.
Figure 4C:
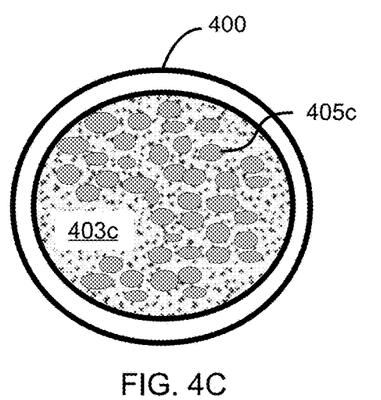
FIG. 4C illustrates a multi-compartmentalized microcapsule in which a first reactant is dispersed within a second reactant.
Figure 4D:
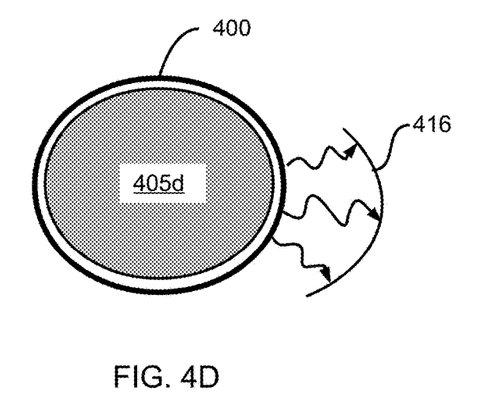
FIG. 4D illustrates a multi-compartmentalized microcapsule in which reactants within the microcapsule have generated heat.

FIG. 4A, FIG. 4B, FIG. 4C, and FIG. 4D illustrate configurations of a multi-compartmentalized microcapsule under a compressive force, and the compression causing the reactants within the microcapsule to mix, according to various embodiments. FIG. 4A illustrates a first microcapsule containing reactants and an inner microcapsule. FIG. 4B illustrates the first microcapsule of FIG. 4A in which the inner microcapsule wall is ruptured. FIG. 4C illustrates the first microcapsule of FIG. 4B in which a reactant contained in the inner microcapsule is dispersed within a reactant initially surrounding the inner microcapsule. FIG. 4D illustrates the first microcapsule of FIG. 4C in which the reactants have produced a reaction product within the first microcapsule and generated heat.

In more detail, FIG. 4A illustrates a microcapsule 400 formed similar to the structure of the microcapsule 300 of FIG. 3A. Microcapsule 400 may have an outer wall 401 and may contain a first reactant 403 and an inner capsule 402*a*. The inner capsule 402*a* may have an outer capsule wall 404*a* and may contain a second reactant 405*a*.

A compressive force may be applied to the microcapsule 400*a*, which may cause the capsule wall 404*a* of an inner microcapsule 402*a* to rupture. FIG. 4B illustrates a configuration of microcapsule 400 in which the capsule wall 404*b* of the inner microcapsule 402*b* may rupture under compression of the microcapsule 400, indicated by the broken line of the capsule wall 404*b*. FIG. 4C illustrates the configuration of microcapsule 400 in which the second reactant 405*c* may become dispersed within the first reactant 403*c*, in response to the inner microcapsule 402*b* having ruptured. The dispersion of the second reactant 405*c* within the first reactant 403*c* may cause them to react.

FIG. 4D illustrates a configuration of microcapsule 400 in which the reactants 403*c* and 405*c* may have come into contact and may have reacted. The microcapsule 400 may contain the product 405*d* of the reaction of 403*c* and 405*c* and the microcapsule 400 may contain the reaction product 405*d* so as to prevent the reaction product from contacting a material in which microcapsule 400 may be itself dispersed. The reactants 403*c* and 405*c* may have reacted exothermically to produce heat 416, and the heat may, as illustrated in FIG. 4D, transfer from the microcapsule 400 to a material in which the microcapsule is dispersed.

In various embodiments, a self-heating TIM may utilize a microcapsule containing an oxidizing and a reducing agent to produce an exothermic reaction, such as oxygen and iron, respectively, according to the reaction equation:

$$4Fe(s) + 3O_2(g) \Longrightarrow 2Fe_2O_3(s) \quad Hrxn = -1.65103 Kj$$

According to the reaction equation 4 moles of iron react with 3 moles of oxygen, such that in an embodiment iron may comprise 53% of the combined mass of the two reactants and oxygen may comprise 43% of that combined mass. In an additional embodiment, a microcapsule may contain iron powder and hydrogen peroxide. The iron powder may be mixed with a catalyst such as ferric nitrate, which when in contact with the hydrogen peroxide liberates oxygen to react exothermically with the iron powder. For example, the microcapsule may use 1.5 moles of hydrogen peroxide per mole of iron, for example 0.56 grams of iron powder to 0.51 grams of hydrogen peroxide. The catalytic amount of ferric nitrate may be chosen to achieve a desired reaction rate of heating, in Kilojoules per second. For example, between 0.001 and 0.005 gram equivalents of ferric nitrate per liter of hydrogen peroxide results in a reaction rate producing heat at between 100 and 500 Kilojoules per second.

With reference again to the microcapsule 300 of FIG. 3A, a microcapsule may contain a mixture of iron powder and ferric nitrate in the inner microcapsule 302 as the second reactant 305 and may contain hydrogen peroxide as the first reactant 303 surrounding the inner microcapsule 302. Alternatively the inner microcapsule 302 may contain hydrogen peroxide as the first reactant 303 of the outer microcapsule may be a mixture of iron and ferric nitrate as the second reactant 305. In some embodiments a microcapsule may have a diameter of less than 5.0 microns, or a microcapsule may have a smaller diameter of less than 2.0 microns. A ratio of 0.2 percent of such microcapsules per unit mass of the TIM may produce a temperature increase of at least 1.04 degrees C. per gram of TIM, and may achieve a compliance value for a high efficiency TIMs that results in a bond line as thin as 2.0 microns.

A structure similar to microcapsule 310 of FIG. 3B, including the various embodiments thereof, may operate similarly to the microcapsule 400 of FIG. 4A through FIG. 4D to rupture the membrane 314, mix the reactants 303 and 305, and produce heat from an exothermic reaction 416 of the reactants. It would be further apparent to one of ordinary skill in that art that an exothermic reaction may be produced by more than two reactants, and that more than two reactants within a capsule may be isolated by more than one inner capsule or membrane, or more than one of any other form of barrier isolating the reactants within the capsule. A variety of reactants may be substituted to produce an exothermic reaction, or a variety of reaction rates and total heat produced, according to the manner of the invention.

Figure 5:
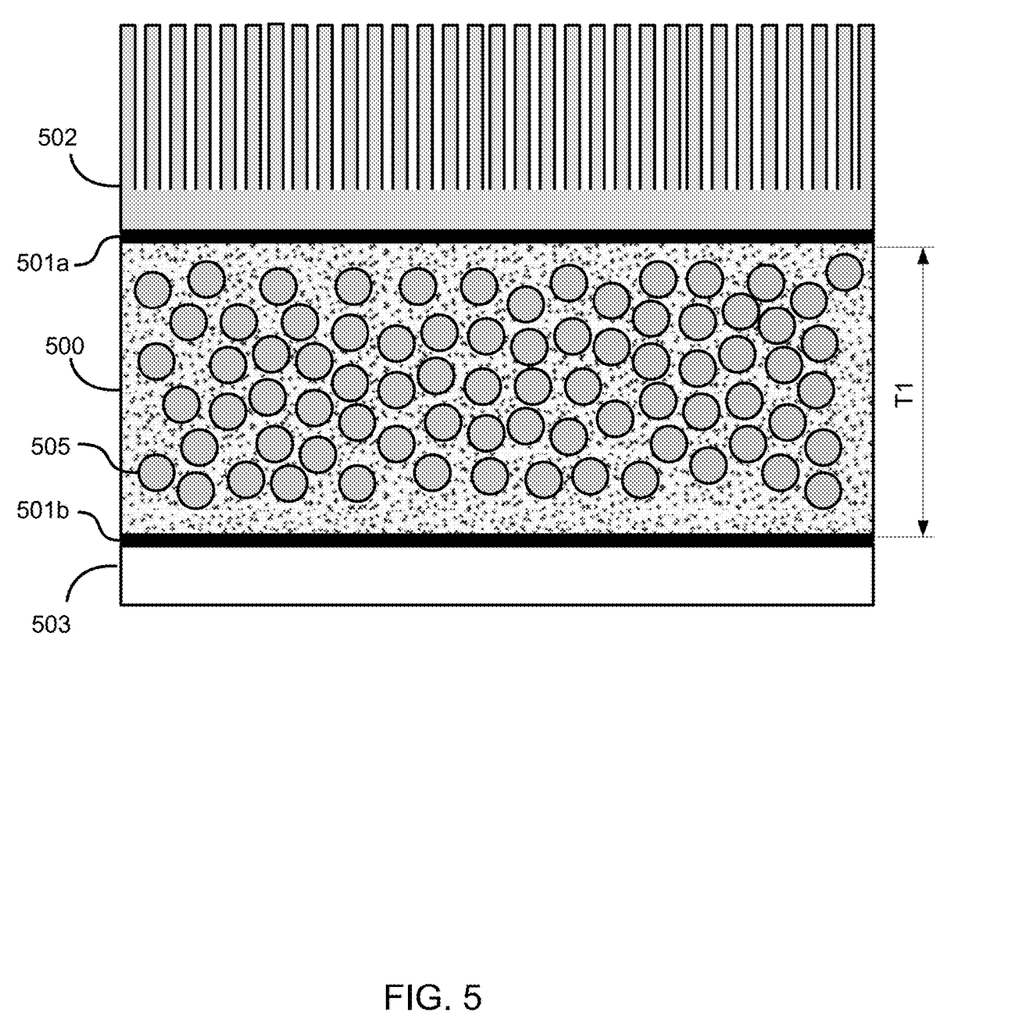
FIG. 5 depicts a self-heating TIM interspersed with exothermic microcapsules, according to various embodiments.

FIG. 5 illustrates a cutaway view of a self-heating TIM 500 interposed between a heat sink 502 and an electrical device 503, such as a processor or ASIC module. The TIM 500 contacts the surfaces of the heat sink 502 at 501a and the device 503 at 501b, and may have a bond line (i.e., the mass of TIM 500 between surfaces 501a and 501b) thickness T1 at ambient temperatures. The TIM 500 may have dispersed within it a plurality of heating components 505.

When the TIM is compressed between the heat sink 502 and device 503, the heating components 505 may initiate a reaction and the reaction may produce heat. The heat may be transferred to the TIM 500, and heating the TIM 500 may increase the compliance of the TIM 500. Increasing the compliance of the TIM 500 may produce a bond line thickness of the TIM 500 less than T1. In various embodiments, the heating components may be a structure similar to a microcapsule 300 or 310 as described in reference to FIG. 3A and FIG. 3B, respectively. Embodiments may disperse heating components, such as microcapsules 300 or 310, in a TIM 500, and a TIM 500 may be a high efficiency TIM including a phase-change TIM, a silicone based TIM, or an acrylate based TIM.

Figure 6:
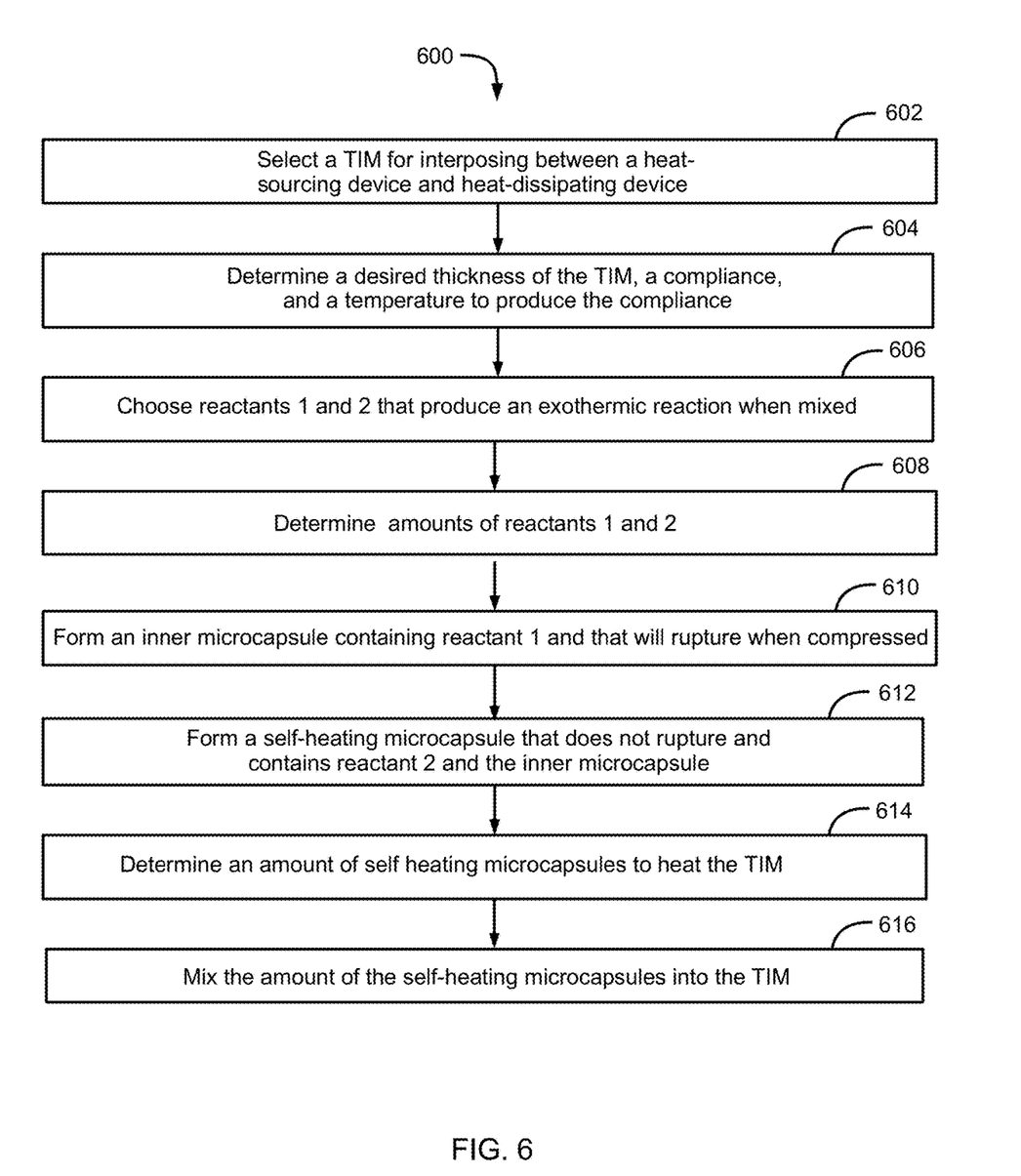
FIG. 6 is a flowchart showing an exemplary process for forming a self-heating TIM, according to various embodiments.

FIG. 6 exemplifies a method 600 to form a self-heating TIM, particularly in an embodiment using a microcapsule according to one feature of the invention. From a discussion of the method 600 it will be apparent to one of ordinary skill in the art the manner of modifying or adapting the method to a variety of embodiments, including other embodiments of a heating component to disperse within a TIM. The method 600 should be understood to illustrate one manner of forming a self-heating TIM for purposes of understanding the invention and should not be considered as limiting the embodiments.

In method 600 at step 602 a TIM is chosen with consideration for the application of that TIM to a particular electronic or mechanical assembly or the components thereof. In one embodiment, a TIM may be chosen for application in joining a heat sink to an electronic component and a high efficiency TIM, such as previously disclosed herein, may be selected. In other embodiments, a TIM may be chosen for an application for joining heat sinks to mechanical assemblies or components thereof.

At step 604 a desired thickness, or a desired range of thickness, of a bond line of the TIM may be determined suitable for the application. For example, the desired thickness may be less than 5 microns or may be less than 2 microns. At step 604 a desired thickness may be determined in relationship to a particular compliance, or range of compliance, values of the TIM, and a temperature of the TIM that may produce the compliance may be determined.

At step 606 exothermic reactants compatible with the materials suitable for forming a microcapsule may be chosen. The exothermic reactants may be chosen to be inert with respect to the selected TIM, the material of the microcapsule walls, or an isolating barrier within a microcapsule when the reactants are not in contact. These may be chosen to be inert with respect to the TIM or the outer microcapsule wall when the reactants are in contact, or such that the chemical products of the reaction are inert with respect to the TIM, outer microcapsule wall, and any remnants of the inner microcapsule wall or barrier.

At step 608 an amount of the first reactant and an amount of the second reactant may be determined. The amounts may be determined from the total amount of the reactants required to produce a desired amount of heat, the ratio of each reactant according to a reaction equation, the desired dimensions of the microcapsule, and the manner of isolating the reactants within the capsule. For example, a microcapsule may be desired having a maximum dimension less than or equal to a desired final thickness of a TIM bond line, such as less than 0.5 microns and the amount of reactants may be chosen corresponding to the volume available within a microcapsule formed according to that dimension.

At step 610 one or more inner microcapsules, such as illustrated by microcapsule 302 of FIG. 3B, may be formed and the inner microcapsules may contain a first or a second reactant. In various embodiments, an inner microcapsule may be formed to contain a mixture of fine iron powder and ferric nitrate, or may be formed to contain hydrogen peroxide. The inner microcapsule(s) may be formed with a capsule wall configured to rupture with application of a compressive force. The force required to rupture an inner microcapsule wall may be determined from within the range of compressive force typical of the manner of joining or fastening a heat sink to a heat-sourcing device at a TIM bond line in the manufacture or repair of the electronic or mechanical assemblies and components thereof.

At step 612 an outer microcapsule may be formed containing the inner microcapsule(s) and one or more other reactants, in the manner of microcapsule 300 in FIG. 3A. The reactant(s) contained in the outer microcapsule may be inert with respect to each other and the microcapsule walls until in contact with one or more reactants contained in one or more inner microcapsules. In one embodiment an outer microcapsule may contain hydrogen peroxide, or other oxidizers, where one or more inner microcapsules contain finely powered iron and ferric nitrate, or other reductants. In another embodiment the outer microcapsule may contain finely powered iron and ferric nitrate, or other reductants, where one or more inner microcapsules may contain hydrogen peroxide or other oxidizers. The capsule wall of the outer microcapsule may be formed to not rupture at the compressive force, determined in step 610, applied to rupture the capsule wall of the inner microcapsule.

Alternatively, an embodiment may utilize a microcapsule having a structure as illustrated by microcapsule 310 in FIG. 3B. Step 608 may be omitted with respect to forming an inner microcapsule and, at step 610, an outer microcapsule may be formed having one or more membranes, in the manner of microcapsule 314 in FIG. 3B, forming two (or more) compartments within the outer microcapsule. The particular reactants may be contained within the compartments, and the membrane(s) may be formed to rupture at compressive forces such as described in step 610 with respect to the capsule wall of an inner microcapsule.

At step 614 a proportional amount of microcapsules may be determined to mix within the TIM. The determination may be made according to the amount of heat required to raise a particular amount of TIM from the ambient temperature to the temperature required to produce the desired compliance of the TIM, considering also of the amount of heat produced by compressing a single microcapsule.

At step 616 an amount of TIM to apply to join a particular heat-sourcing device and a heat sink may be determined, and a corresponding amount of microcapsules may be mixed into the TIM. For example, a TIM may be a high efficiency TIM and the TIM may achieve a desired compliance at a temperature of the TIM at least 31 degrees C. above room ambient temperature. In the embodiment, utilizing the reactants and reaction described in reference to FIG. 4A through FIG. 4D may require at least 0.6 grams of the combined amounts of the reactants dispersed within 30 grams of any of the preferred high efficiency TIMs.

Figure 7:
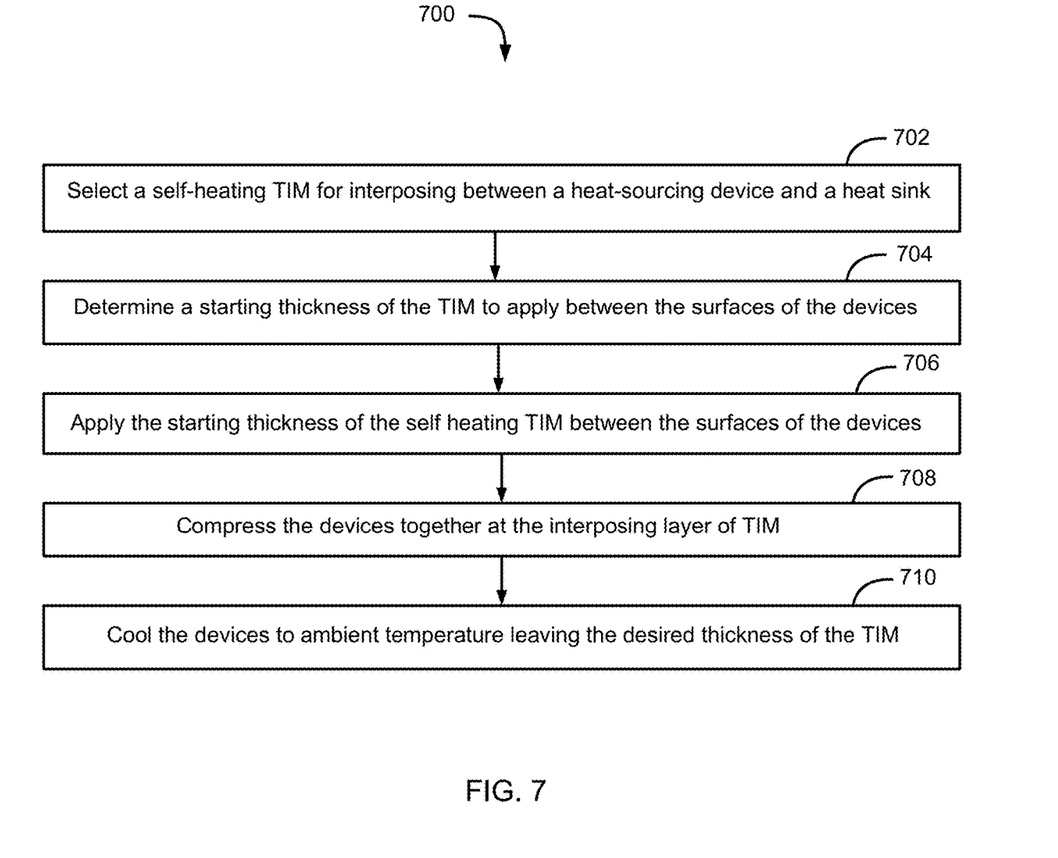
FIG. 7 is flowchart showing an exemplary process for joining a heat-sourcing device to a heat-dissipating device with an interposing layer of a self-heating TIM, according to various embodiments.

FIG. 7 illustrates a method 700 for applying a self-heating TIM to reduce the thickness of the TIM bond line between a heat-sourcing (i.e. computer processor) and a heat-dissipating device (i.e., heat sink). In step 702 a self-heating TIM may be selected. The selection may consider particular properties of the TIM and of the assembly and heat-sourcing and heat-dissipating devices. The particular properties considered may include the thermal conductivity of the TIM, the durability of the TIM, the shear strength of TIM, the chemical or physical suitability of the TIM with the heat-sourcing and heat sink devices, the compliance of the TIM at the ambient temperature, or the initial and desired final thickness of the TIM bond line between the devices. In various embodiments the heat-sourcing device may be an electronic component or an electronic assembly, or may be a mechanical device or mechanical assembly. In an embodiment a TIM may be selected from a class of high efficiency TIMs and may consider properties particular to a TIM desirable for that application. Other considerations may apply to a particular assembly, devices, manufacturing process, or field repair process and will be evident to one of ordinary skill in the art.

At step 704 an amount of TIM may be determined that produces an initial bond line thickness between the heat-sourcing and heat-dissipating devices. The compliance of the TIM at the ambient temperature of manufacture or repair may determine the initial thickness of the TIM. For example, in an embodiment an initial thickness of a high performance TIM may be 5.0 microns or more, and a final thickness of the bond line after heating the TIM may be desired to be less than 2.0 microns.

At step 706 a selected TIM may be applied in the initial bond line thickness of step 704 between the surfaces joining the heat sourcing device and the heat-dissipating device. At step 708 the devices may be joined together at the bond line of the TIM and joining the devices may compress the TIM. In some embodiments a heat-dissipating device may be mechanically fastened to a heat-sourcing device. For example, a heat sink may be joined to an electronic component utilizing fasteners such as screws, bolts, or springs. In other embodiments, the devices may be joined with an adhesive compound mixed with or a property of a TIM, and the devices may be pressed together, until the adhesive may cure, at the bond line of the TIM and compress the TIM. Accordingly, the compressive force applied to the TIM may vary within a range typical of the manufacture of electronic or mechanical assemblies and their components having heat-dissipating devices (e.g., heat sinks), or within a range of mechanical pressure applied to join the heat-sourcing and heat-dissipating devices until the adhesive has cured or otherwise had effect to bond the devices.

At step 708 compressing the TIM may produce an exothermic reaction acting to heat the TIM, and the increased temperature of the TIM may produce a second compliance of the TIM, and the second compliance of the TIM may produce a desired final thickness of the TIM bond line. At 710 the TIM, the heat-sourcing device, and the heat-dissipating devices may be cooled to ambient temperature or to a temperature corresponding to normal operations of the assembly or component.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method for creating a self-heating thermal interface material (TIM), the method comprising:
    selecting a TIM, the TIM having a first compliance at a first temperature, the TIM having a second compliance at a second temperature, wherein the TIM is selected from the group consisting of a phase-change TIM, a silicone based TIM, an acrylate based TIM, and a mixture including any of a phase-change TIM, a silicone based TIM, and an acrylate based TIM;
    forming at least one heating component, the at least one heating component producing heat when subjected to a compressive force, the heat produced by the at least one heating component transferring to the TIM, wherein the heating component comprises at least one first reactant and at least one second reactant, and the at least one heating component prevents the first reactant from contacting the second reactant in the absence of the compressive force, and allow the at least one first reactant and the at least one second reactant to come into contact upon application of the compressive force, the first and second reactants coming into contact produce an exothermic reaction, the exothermic reaction producing the heat transferred to the TIM;

determining an amount of the at least one heating component sufficient to increase the temperature of the TIM, the increased temperature producing the second compliance; and dispersing the amount of the at least one heating component within the TIM.

2. The method of claim 1 wherein the at least one first reactant is hydrogen peroxide and the at least one second reactant includes iron and a catalytic amount of ferric nitrate.

3. The method of claim 1 wherein the forming the at least one heating component further comprises:

forming the at least one heating component from at least one first microcapsule, the at least one first microcapsule having a first outer shell;

forming the first outer shell to sustain application of the compressive force to the at least one first microcapsule without rupturing;

wherein the at least one first microcapsule contains the at least one first reactant and the at least one second reactant;

forming the at least one first microcapsule to contain at least one isolating structure within the first outer shell, the at least one isolating structure preventing the at least one first reactant and the at least one second reactant from coming into contact when the at least one first microcapsule is not subjected to the compressive force;

forming the at last one isolating structure to rupture upon application of the compressive force to the at last one first microcapsule, the rupturing causing the at least one first reactant and the at least one second reactant to come into contact, the contact producing the exothermic reaction.

4. The method of claim 3 further comprising:

forming the at least one isolating structure as at least one second microcapsule, the at least one second microcapsule containing the at least one second reactant, the at least one first microcapsule containing the at least one second microcapsule within the at least one first reactant; and forming the at least one second microcapsule having a second outer shell, the second outer shell configured to rupture when the at least one first microcapsule is subjected to the compressive force.

5. The method of claim 3 wherein the exothermic reaction produces one or more chemical products, and further comprising forming the first outer shell of the at least one first microcapsule to prevent the at least one first reactant, the at least one second reactant, and the one or more chemical products of the exothermic reaction from coming into contact with the TIM.

6. The method of claim 3, wherein the at least one isolating structure is at least one membrane, the at least one membrane separating two or more compartments of the first microcapsule, and wherein the at least one first reactant is contained within a first compartment and the at least one second reactant is contained within a second compartment.

7. The method of claim 3, wherein the at least one first reactant and the at least one second reactant are inert with respect to one or more of the TIM, the at least one first microcapsule, and the isolating structure.

8. The method of claim 3, wherein the exothermic reaction produces one or more chemical products, and wherein one or more of the TIM, the at least one first microcapsule, and the isolating structure are inert with respect to the one or more chemical products of the exothermic reaction.

\* \* \* \* \*